(12) United States Patent
Friedman et al.

(10) Patent No.: US 7,579,887 B1
(45) Date of Patent: Aug. 25, 2009

(54) TECHNIQUE FOR EFFICIENTLY MANAGING BOTH SHORT-TERM AND LONG-TERM FREQUENCY ADJUSTMENTS OF AN ELECTRONIC CIRCUIT CLOCK SIGNAL

(75) Inventors: Daniel Joseph Friedman, Sleepy Hollow, NY (US); Phillip John Restie, Katonah, NY (US); Alexander V. Rylyakov, Mount Kisco, NY (US); Jose A. Tierno, Stamford, CT (US)

(73) Assignee: International Bsuiness Machines Corporation, Armonk, NY (US)

( * ) Notice: Subject to any disclaimer, the term of this patent is extended or adjusted under 35 U.S.C. 154(b) by 15 days.

(21) Appl. No.: 12/024,457

(22) Filed: Feb. 1, 2008

(51) Int. Cl.
*H03L 7/00* (2006.01)
(52) U.S. Cl. ...................... 327/156; 327/159
(58) Field of Classification Search ............ None
See application file for complete search history.

(56) References Cited

U.S. PATENT DOCUMENTS

| | | | |
|---|---|---|---|
| 5,940,785 A | 8/1999 | Georgiou et al. | |
| 6,535,986 B1 | 3/2003 | Rosno et al. | |
| 6,934,872 B2 | 8/2005 | Wong et al. | |
| 7,132,895 B2 * | 11/2006 | Roth | 331/1 A |
| 7,385,539 B2 * | 6/2008 | Vanselow et al. | 341/143 |
| 2002/0070811 A1 * | 6/2002 | Skierszkan | 331/1 A |
| 2006/0215798 A1 * | 9/2006 | Nelson | 375/376 |
| 2007/0025490 A1 * | 2/2007 | Azadet et al. | 375/376 |
| 2007/0222526 A1 * | 9/2007 | Mayer et al. | 331/34 |

OTHER PUBLICATIONS

Uht, A.K., "Uniprocessor Performance Enhancement Through Adaptive Clock Frequency Control", IEEE Computer Society, vol. 54, No. 2, Feb. 2005. pp. 132-140.
Liotta, "Wide Range of Output Frequencies Differentiates Fully Integrated Clock",retrieved Mar. 3, 2008, pp. 1-3. http://electronicdesign.com/Article/Index.cfm?AD=1&ArticleID=9611.
Mahashin, "Optimize Timing Margins For Your High-Speed Interface", retrieved on Mar. 5, 2008, pp. 1-9. http://electronicdesign.com/Article/Index.cfm?AD=1&ArticleID=9611.

* cited by examiner

*Primary Examiner*—Cassandra Cox
(74) *Attorney, Agent, or Firm*—Yee & Associates, P.C.; Diana R. Gerhardt

(57) ABSTRACT

A control system for generating an electronic circuit clock signal that can optimize operating frequency margins by responding to short term effects by quickly varying the clock frequency and long term effects by finding an optimal frequency point. A sensor indicates frequency margins associated with safe use of the clock signal, and these frequency margins are input into a frequency compensator and used to determine whether the system is operating within acceptable margins, or alternatively to modify the operating clock frequency on a short-term basis in order to achieve acceptable operating margins. The requests for frequency adjustment by the frequency compensator are provided to a frequency filter, which combines such request with a maintained/accumulated history of previous short-term frequency requests that have previously been made in order to determine whether an update needs to be made to the target frequency to provide long-term frequency control.

12 Claims, 3 Drawing Sheets

US 7,579,887 B1

TECHNIQUE FOR EFFICIENTLY MANAGING BOTH SHORT-TERM AND LONG-TERM FREQUENCY ADJUSTMENTS OF AN ELECTRONIC CIRCUIT CLOCK SIGNAL

This invention was made with the United States Government support under Agreement No. HR0011-07-9-0002 awarded by DARPA. THE GOVERNMENT HAS CERTAIN RIGHTS IN THE INVENTION.

BACKGROUND

1. Field of the Invention

The present application relates generally to electronic circuits and more particularly, the present application relates to techniques for providing both short-term and long-term adjustments to the operating frequency of a clock circuit used to clock an electronic circuit device such as an integrated circuit device.

2. Description of the Related Art

Given a system that uses a clock signal for timing (as a digital circuit, for example), an ability to adjust that clock signals' frequency is desirable in order to compensate for various effects (for example, voltage and temperature variations, or aging) or to optimize some measure of performance (for example, maximize frequency of operation, minimize power of operation). The environment influences what frequencies are acceptable to the circuit both in the short term (few clock cycles, few tens of clock cycles) and in the long term (hundreds/thousands of clock cycles). For example, noise in the power supply of a CMOS digital circuit will have a short term effect, while temperature variations of the same circuit will have a long term effect.

It would thus be desirable to provide a clocking mechanism that is suitable for accommodating a widely diverse operation environment with its associated unique clocking requirements.

SUMMARY

Provided by the following description is a control system for generating an electronic circuit clock signal that can optimize operating frequency margins. This control system has the flexibility to respond to short term effects by quickly varying the clock frequency, as well as long term effects by finding an optimal frequency point. Together with the clocked system, there is a sensor capable of indicating the frequency margins associated with safe use of the clock signal. These frequency margins are input into a short-term frequency compensator and used to determine whether the system is operating within acceptable margins, or alternatively to modify the operating clock frequency on a short-term basis in order to achieve acceptable operating margins. The requests for frequency adjustment by the short-term frequency compensator are provided to a variable frequency filter, which combines such request with a maintained/accumulated history of previous short-term frequency requests that have previously been made in order to determine whether an update needs to be made to the target frequency to provide long-term frequency control. The result of such long-term adjustment is to move the overall operating frequency to a point such that the DC value of the short term requests becomes zero.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Figure 1:
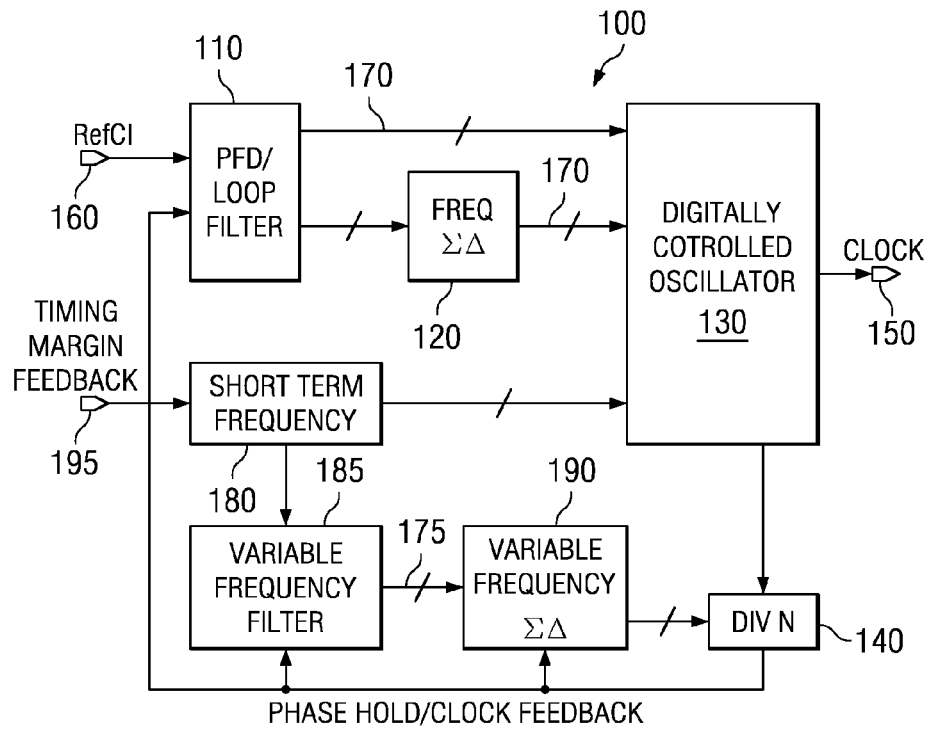
FIG. 1 depicts a block diagram of the overall system in which the mechanism for both short-term and long-term frequency adjustments will operate.

A control system is provided for generating an electronic circuit clock signal that optimizes operating frequency margins. This control system has the flexibility to respond to short term effects by quickly varying the clock frequency, as well as long term effects by finding an optimal frequency point. Together with the clocked system, there is a sensor capable of indicating the frequency margins associated with safe use of the clock signal. These frequency margins are input into a short-term frequency compensator and used to determine whether the system is operating within acceptable margins, or alternatively to modify the operating clock frequency on a short-term basis in order to achieve acceptable operating margins. The requests for frequency adjustment by the short-term frequency compensator are provided to a variable frequency filter, which combines such request with a maintained/accumulated history of previous short-term frequency requests that have previously been made in order to determine whether an update needs to be made to the target frequency to provide long-term frequency control.

The system has the following components:

a digital clocked circuit (for which a clock signal is generated for)

a timing margin monitor: a device that monitors timing margins (ideally worst-case) of the clocked circuit and provides feedback as to whether the current timing margin is above or below a margin threshold a short and long-term controllable frequency synthesizer: a synthesizer that responds to 2 classes of frequency control, namely, a target frequency word (for long-term control) and a short term frequency change word (for short-term control)

a short term frequency compensator: a device that takes an input from the timing margin monitor and generates a short term frequency change word variable frequency filter: device that adjusts the target frequency and is driven by input from the short term frequency compensator In operation, the system stably maintains the synthesizer at a target timing margin operating point, adjusting output cycle times using its short- and long-term control mechanisms as needed to achieve this end. One way to analyze the behavior of the mechanism for short- and long-term frequency adjustments as per the features provided herein is to consider an example of how the mechanism operates when input is received from the timing margin monitor. In this depicted example, the currently detected timing margin has just crossed below a minimum acceptable threshold. The mechanism operates as follows:

1. The timing margin monitor indicates margin is too low.

2. The short-term frequency compensator requests a decrease in frequency which is executed by the DCO; these requests continue until the timing margin fault condition is corrected.

3. The request for a decrease in frequency is also provided to the variable frequency filter, which combines this request with an accumulated history regarding previous short-term frequency change requests and determines whether an update to the target (long-term) frequency is made.

4. The action of the main frequency loop in the short- and long-term controllable frequency synthesizer restores the operating frequency to the current target (original or updated); the time constant associated with this action is significantly longer than that of the response to the short-term frequency.

In general, the mechanism operates by handling short term requests immediately via the short-term frequency compensator, while long-term updates to the target frequency are handled by the variable frequency filter's processing of the stream of incoming short-term requests. The long-term behavior of the system will act to move the frequency to a point such that the DC value of the short term requests is 0.

FIG. 1 shows a block diagram 100 of the overall system in which the mechanism for both short-term and long-term frequency adjustments will operate. The core of the structure is a digital phase locked loop (DPLL) as realized by the phase frequency detector/loop filter (PFD/LF) 110, frequency sigma-delta 120, digitally controlled oscillator (DCO) 130, and Div-N feedback divider 140. A digitally controlled oscillator is preferably employed, since multiple control inputs can be added as simple digital circuits to implement the various control inputs required by this scheme. The base operation of these components of the loop is to synthesize an output (clock) frequency 150 that is N times the frequency of the input reference clock 160. Feedback signals in this case are generated by comparing the phase of the reference clock with that of the feedback clock by the phase frequency detector/loop filter (PFD/LF) 110. The results of these comparisons (carried out in the phase and frequency detector), are processed by the loop filter, creating a digital word at 170 intended to set the frequency of the DCO. Because realizing a DCO with sufficient control bits for direct application of the full control word is impractical, the least significant bits of the control word are applied as dither signals encoded by a sigma-delta modulator 120.

The additional components shown in FIG. 1, such as the short term frequency compensator 180, variable frequency filter 185, and the variable frequency sigma delta blocks 190, enable the augmentation of the DPLL to create the mechanism for both short- and long-term frequency adjustments. The short-term frequency compensator 180 takes input directly from the timing margin monitor at 195 and produces output that is directly applied to control the DCO 130. In addition, the short term frequency output is provided to the variable frequency filter 185, which processes this data in conjunction with feedback clock frequency from the Div-N feedback divider 140 to determine whether an update in target (long-term) frequency is warranted. If so, this update is realized by changing the divider control setting in the variable frequency sigma delta modulator in order to update the target frequency by sending a target frequency control word using control path 175 to change the divider control setting in order to effectuate a change in the divide-by-N divider circuit 140 such that the feedback loop provided at the input of the PFD/Loop Filter 110 adjusts the clock frequency on a more long term basis using this traditional DPLL feedback path.

Figure 2:
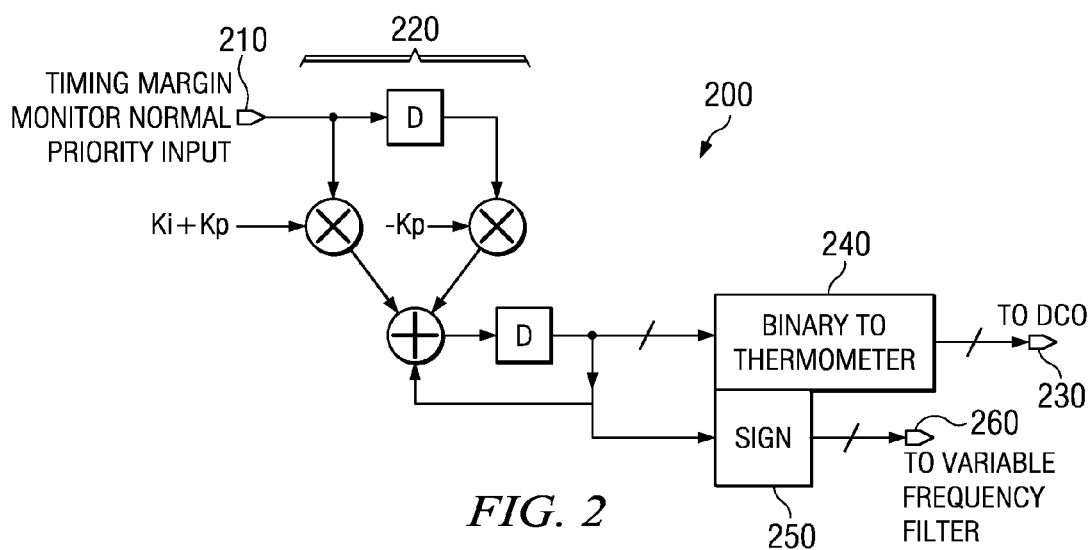
FIG. 2 shows a detailed diagram of the short term frequency compensation block/timing margin filter shown in FIG. 1, at element 180.

FIG. 2 shows a detailed diagram at 200 of the short term frequency compensation block 180 of FIG. 1. The normal priority timing margin monitor input at 210 is processed using a proportional/integral filter 220, with the resulting processed output applied to the DCO at 230 (by way of binary-to-thermometer block 240). Normal priority controls are provided to the variable frequency filter. The purpose of this is to enable the overall system to maintain the accumulator 270 in the short term frequency compensation block in a state such that it does not saturate either full or empty. The average value of the accumulator 270 is used in the variable frequency filter to create a new target frequency. Because this new target frequency is closer to what the timing margin monitor is requesting in average, the average value of the timing margin monitor will be reduced, and the accumulator value inside the timing margin filter 200 will be driven down to zero.

The frequency filter 220 has two parameters, an integration constant Ki and a proportional constant Kp. The integration constant determines how fast will the frequency filter reach equilibrium (that is, when the output frequency is such that the average value of the timing margin monitor is zero, and the accumulator of the timing margin filter has been driven to zero). The proportional constant acts as a damping factor to prevent the closed loop filter from bouncing around the equilibrium condition. The value of the accumulator of the timing margin filter 220 is applied to the DCO, either directly or through some suitable encoding. A binary-to-thermometer encoder 240 can be used to apply a control signal to the DCO in a timing insensitive way. Other encodings are also possible. The value of the timing margin compensation accumulator is compared with a target value (for example, zero) at sign block 250, and the difference is used to drive the frequency filter at 260. When the loop is closed through the frequency filter 185 (FIG. 1), DCO 130 (FIG. 1), timing margin circuit (not shown), timing margin compensation filter 200, back to the frequency filter 185, the timing margin compensation accumulator is forced to be equal to the target frequency in steady state. Taking the sign of the accumulator (by sign block 250) as the input to the frequency filter 185 (FIG. 1) forces the value of the accumulator to zero in steady state.

Figure 3:
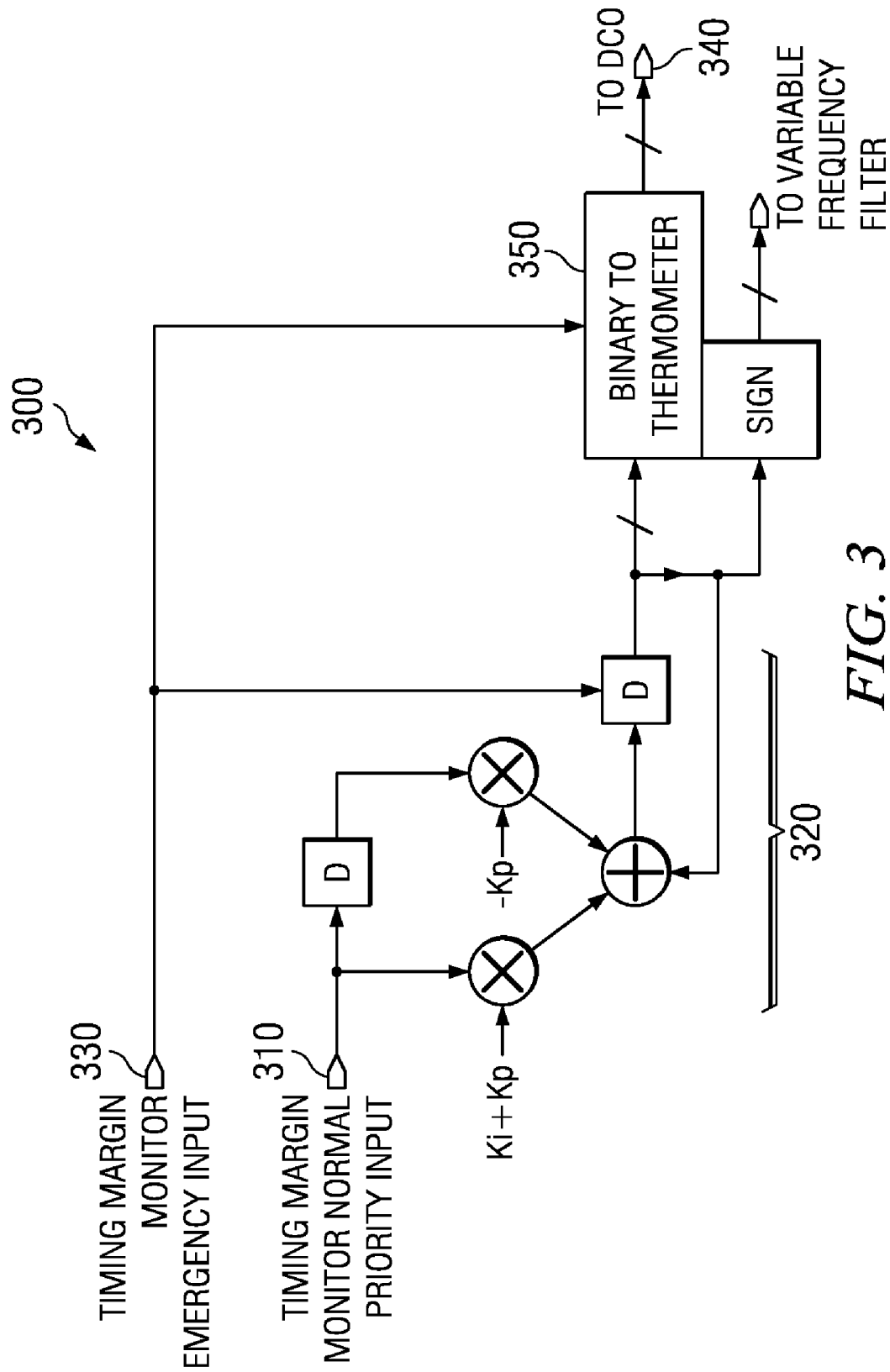
FIG. 3 shows a detailed diagram of a short term frequency compensation block that includes a timing margin emergency path.

FIG. 3 shows a diagram at 300 of the short term frequency compensation block with optional emergency timing margin path added to the circuit 200 previously described in FIG. 2. Note that in this case, two possible types of timing margin monitor input are provided, namely, the normal priority input 310 as in FIG. 2 as well as emergency input 330. The emergency input 330 is not passed through a filter 320 before it is applied to the DCO at 340 (by way of binary-to-thermometer block 350), thus minimizing overall synthesizer response time. As in FIG. 2, the normal priority timing margin monitor input 310 is processed using a proportional/integral filter 320, with the resulting processed output applied to the DCO at 340 (by way of binary-to-thermometer block 350). Thus, both emergency controls 330 (for short-term frequency adjustment) as well as processed normal priority controls 310 (for long-term frequency adjustment) are provided to the variable frequency filter 300. Again, the purpose of this connection is to enable the overall system to maintain the accumulator in the short term frequency compensation block in a state such that it does not saturate either full or empty—i.e. it tracks the average long-term frequency operating point.

Figure 4:
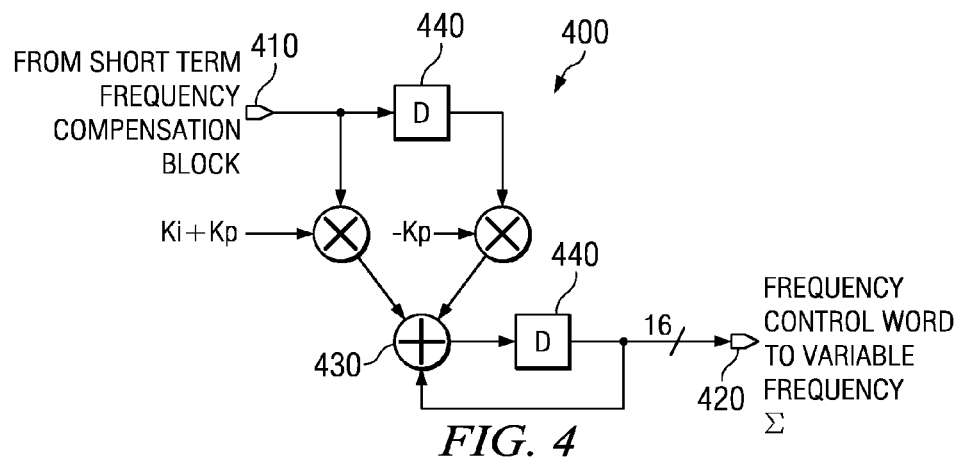
FIG. 4 shows a detailed diagram of the variable frequency filter shown in FIG. 1, at element 185.

FIG. 4 shows a diagram of the variable frequency filter at 400, such as variable frequency filter element 185 of FIG. 1.

The filtered timing margin monitor data provided at 410 by the short term frequency compensation block (element 180 of FIG. 1) is in turn filtered in the variable frequency filter 400. The data latches 440 are clocked by a clock signal (not shown) from the Div-N block 140 (FIG. 1). The output of the frequency filter is provided at 420 to the sigma-delta variable frequency divider (element 190 of FIG. 1) to set the divide ratio (and hence the frequency target) for the DPLL. Because the short term information from the short term frequency compensation block is integrated in a closed loop at 430, this device will force the frequency output of the DCO 130 (as depicted in FIG. 1) to a value that drives the input from the short term frequency compensation block to zero. This has the desired effect of centering the accumulator output of the short term frequency compensation block within its overall range, restoring and maintaining short term control block range to increase or decrease frequency as required.

Figure 5:
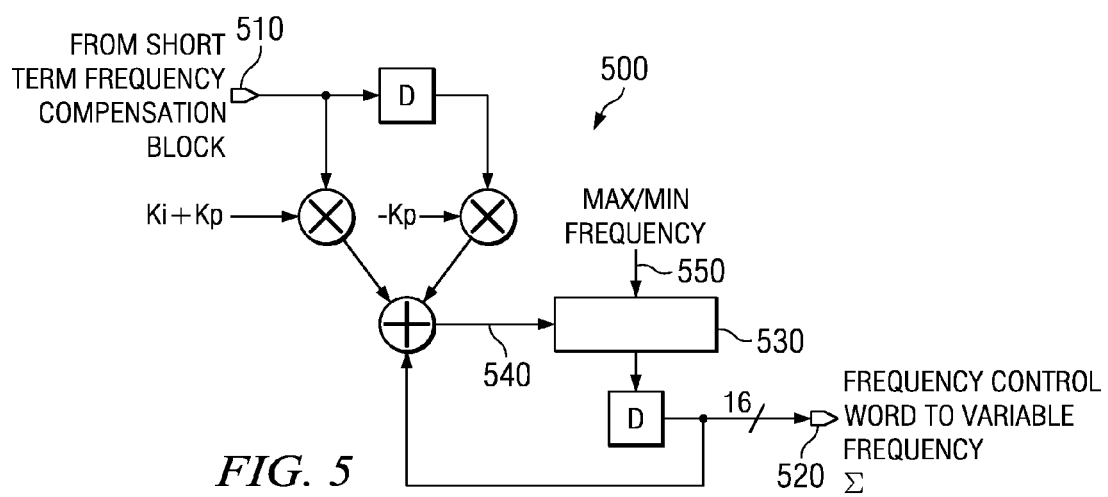
FIG. 5 shows a detailed diagram a variable frequency filter that includes saturation logic.

FIG. 5 shows a diagram at 500 of the variable frequency filter 400 of FIG. 4 with the addition of a saturation logic block 530. The saturation logic block is intended to enforce minimum and maximum frequency control words that can be applied to the divider controls. In this case, the variable frequency filter operates exactly as was described in reference to FIG. 4 (with element 410 of FIG. 4 being the same as element 510 of FIG. 5, and likewise for elements 420 of FIG. 4 and 520 of FIG. 5) as long as the output frequency control word at 540 is between the externally supplied minimum and maximum frequency limits at 550. Once either of those limits has been reached, however, the output frequency control word is held at the relevant limit. Thus, timing margin monitor compensation data is accumulated to compute a good multiplication ratio for the DPLL, and the saturation logic maintains the clock frequency within the Max/Min frequency boundaries.

Thus, the provided system as described herein stably maintains the synthesizer (DPLL) at a target timing margin operating point, and adjusts its output cycle times using its short- and long-term control mechanisms as needed to achieve this end.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. An electronic circuit for generating a clock signal, comprising:
    a digitally controlled oscillator (DCO) circuit;
    a phase detector coupled to an input of the digital controlled oscillator circuit;
    a feedback loop coupled between an output of the DCO circuit and an input to the phase detector to provide a digital phase-locked loop circuit that generates the clock signal, wherein the digitally controlled oscillator circuit comprises a first control input for receiving first control words that are used to substantially instantaneously modify a current operating frequency of the clock signal, and wherein the feedback loop receives second control words that are used to modify the current operating frequency of the clock signal based upon the first control words.

2. The electronic circuit of claim 1, wherein the feedback loop comprises a divide-by-N feedback divider coupled between the output of the DCO circuit and the input to the phase detector.

3. The electronic circuit of claim 2, wherein the divide-by-N feedback divider receives the second control words that are used to modify the current operating frequency of the clock signal based upon the first control words.

4. The electronic circuit of claim 1, further comprising a timing margin monitor that monitors timing margins of the electronic circuit and provides feedback as to whether a current timing margin of the electronic circuit is above or below a margin threshold, wherein the first control words are generated based on the feedback.

5. An electronic circuit for generating a clock signal, comprising:
    a digitally controlled oscillator (DCO) circuit;
    a phase detector coupled to an input the digital controlled oscillator circuit;
    a feedback loop coupled between an output of the DCO circuit and an input to the phase detector to provide a digital phase-locked loop circuit that generates the clock signal, wherein the digital phase-locked loop circuit further comprises:
    a short term frequency compensator circuit having an output coupled to the DCO circuit for providing short-term frequency control words, and having an input coupled to a timing margin monitor; and
    a variable frequency filter that receives short-term frequency requests from the short term frequency compensator circuit and periodically adjusts a current frequency of the clock signal using a long-term frequency control word.

6. The electronic circuit of claim 5, wherein the feedback loop comprises a divide-by-N feedback divider coupled between the output of the DCO circuit and the input to the phase detector.

7. The electronic circuit of claim 6, wherein the divide-by-N feedback divider receives the long-term frequency control word from the variable frequency filter.

8. The electronic circuit of claim 5, wherein the variable frequency filter comprises a saturation circuit.

9. The electronic circuit of claim 8, wherein the saturation circuit ensures that the long-term frequency control word generated by the variable frequency filter to periodically adjust the divide-by-N feedback divider does not adjust the clock signal outside a specified maximum/minimum frequency range.

10. The electronic circuit of claim 5, wherein the timing margin monitor monitors timing margins of the electronic circuit and provides feedback as to whether a current timing margin of the electronic circuit is above or below a margin threshold.

11. A method for generating a clock signal for an electronic circuit, comprising steps of:

receiving short term frequency control words and in response thereto immediately adjusting a current operating frequency of the clock signal based on the short term frequency control words;

accumulating a plurality of the short term frequency control words; and generating a long term frequency control word that is used to adjust the current operating frequency of the clock signal based on the accumulated plurality of the short term frequency control words.

12. The method of claim 11, further comprising receiving a timing margin of the electronic circuit by a proportional integral filter that generates the short term frequency control words based on the timing margin, wherein the timing margin indicates whether a current timing margin of the electronic circuit is above or below a margin threshold.

* * * * *